United States Patent
Thies (10) Patent No.: US 7,859,890 B2
(45) Date of Patent: Dec. 28, 2010

(54) MEMORY DEVICE WITH MULTIPLE CAPACITOR TYPES

(75) Inventor: Andreas Thies, Berlin (DE)

(73) Assignee: Qimonda AG, München (DE)

( * ) Notice: Subject to any disclaimer, the term of this patent is extended or adjusted under 35 U.S.C. 154(b) by 295 days.

(21) Appl. No.: 12/200,041

(22) Filed: Aug. 28, 2008

(65) Prior Publication Data

US 2010/0054021 A1    Mar. 4, 2010

(51) Int. Cl.
G11C 11/00    (2006.01)
(52) U.S. Cl. .................. 365/149; 365/102; 257/306; 438/386
(58) Field of Classification Search .............. 365/149, 365/102; 257/296, 306; 438/386, 387
See application file for complete search history.

(56) References Cited

U.S. PATENT DOCUMENTS

| 6,583,458 | B1 * | 6/2003 | Hayashi et al. ............. 257/296 |
| 6,800,890 | B1 | 10/2004 | Wohlfahrt et al. |
| 6,906,374 | B2 * | 6/2005 | Tanaka ....................... 257/306 |
| 6,953,950 | B2 | 10/2005 | Sashida |
| 2001/0012223 | A1 * | 8/2001 | Kohyama ................... 365/200 |
| 2004/0173836 | A1 | 9/2004 | Oh et al. |
| 2005/0265100 | A1 * | 12/2005 | Kitamura et al. ............ 365/210 |
| 2007/0063241 | A1 | 3/2007 | Sashida et al. |

* cited by examiner

*Primary Examiner*—Tuan T Nguyen
*Assistant Examiner*—Toan Le
(74) *Attorney, Agent, or Firm*—Coats & Bennett, P.L.L.C.

(57) ABSTRACT

An integrated circuit includes a memory array portion and a support circuitry portion arranged on a semiconductor substrate. An insulative layer is formed on the semiconductor substrate. Data storage capacitors are located in the memory array portion and extending through the insulative layer. Non-data storage capacitors are located in the support circuitry portion and terminating above the insulative layer.

21 Claims, 13 Drawing Sheets

MEMORY DEVICE WITH MULTIPLE CAPACITOR TYPES

BACKGROUND

Memory devices such as DRAMs use capacitors for storing data. The storage capacitors are arranged in an array and individually accessible via the corresponding word and bit lines. The array of storage capacitors is formed above the active area of a semiconductor substrate in many types of memory devices. That is, the storage capacitors are arranged above the array access transistors, word lines and bit lines and thus commonly referred to as stacked capacitors. Support circuitry is also provided for controlling overall memory device operation and may include sense amplifier circuitry, write driver circuitry, refresh circuitry, address decoder logic, control logic, registers, etc. The support circuitry of a memory device is typically fabricated in a different active region of the semiconductor substrate than the array access transistors, word lines and bit lines of the device.

Capacitors can also be used for non-data storage functions in a memory device. For example, capacitors are usually provided for stabilizing the power supply of the support circuitry. Non-data storage capacitors are typically formed in an active region of the semiconductor substrate and may be spaced apart from the array access transistors, word lines, bit lines and support circuitry. As such, additional semiconductor substrate area is needed to fabricate the non-data storage capacitors. This adds to the overall size of the memory device, increasing cost and decreasing yield.

SUMMARY

In an embodiment, an integrated circuit includes a memory array portion and a support circuitry portion arranged on a semiconductor substrate. An insulative layer is formed on the semiconductor substrate. Data storage capacitors are located in the memory array portion and extending through the insulative layer. Non-data storage capacitors are located in the support circuitry portion and terminating above the insulative layer.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
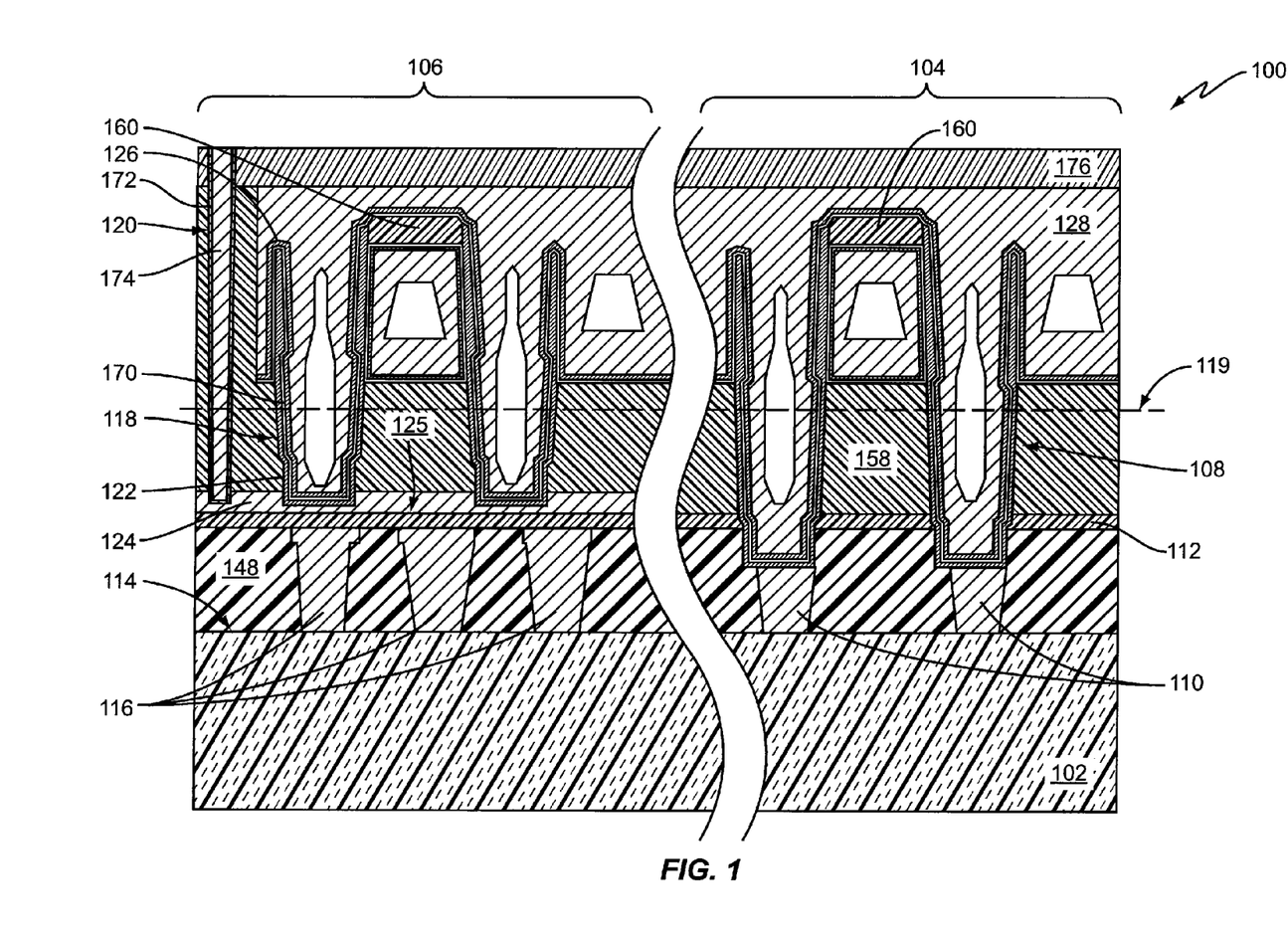
FIG. 1 is a cross-sectional view of an embodiment of an integrated circuit having data storage and non-data storage capacitors.

FIG. 1 illustrates a partial cross-sectional view of a memory device integrated circuit 100. The integrated circuit 100 is fabricated on a semiconductor substrate 102 and has an array portion 104 for storing data and a support circuitry portion 106 for controlling memory device operation. The array portion 104 of the integrated circuit 100 includes a plurality of data storage capacitors 108 arranged above a first active region of the semiconductor substrate 102. The storage capacitors 108 are connected to access transistors (out of view) and wiring 110 arranged below the storage capacitors 108 to form a memory array. The term "memory array wiring" as used herein refers to the wiring 110 located in the array portion 104 of the integrated circuit 100 disposed below the storage capacitors 108 and can include word lines and bit lines coupled to the storage capacitors 108. The memory array wiring 110 is arranged below an insulative layer 112 formed on the substrate 100. The memory array wiring 110 can be disposed on an upper surface 114 of the substrate 100, buried in trenches (not shown) formed in the substrate 102 or some combination thereof.

The support circuitry portion 106 of the integrated circuit 100 similarly has wiring 116 arranged below the insulative layer 112. The support circuitry portion 106 of the integrated circuit 100 can include any type of circuitry for controlling overall operation of the integrated circuit 100 such as sense amplifier circuitry, write driver circuitry, refresh circuitry, address decoder logic, control logic, registers, etc. The term "support circuitry wiring" as used herein refers to the wiring 116 located in the support circuitry portion 106 of the integrated circuit 100 and can be disposed on the upper substrate surface 114, buried in trenches (not shown) formed in the substrate 102 or some combination thereof. The support circuitry portion 106 of the integrated circuit 100 also has capacitors 118 that can be used for non-data storage purposes such as power stabilization, noise filtration, etc. and are hereinafter referred to as non-data storage capacitors for ease of reference only.

The non-data storage capacitors 118 are arranged above the support circuitry wiring 116. This way, little or no additional semiconductor substrate area is consumed by the non-data storage capacitors 118 because the capacitors 118 are not formed in an active region of the substrate 102. Rather, the non-data storage capacitors 118 are formed above the upper surface 114 of the substrate 100. This allows the overall size of the integrated circuit 100 to be reduced. Moreover, both types of capacitors 108, 118 can be formed within the same process steps as described in more detail later when fabricated in a common plane 119 as shown in FIG. 1, simplifying the integrated circuit fabrication process. The common plane 119 runs generally parallel to and above the insulative layer 112.

The data storage capacitors 108 extend through the insulative layer 112, making contact with the underlying memory array wiring 110. Unlike the storage capacitors 108, the non-data storage capacitors 118 do not extend through the insulative layer 112, but terminate above or in it. Accordingly, the non-data storage capacitors 118 are separated from the support circuitry wiring 116 by the insulative layer 112 in the support circuitry portion 106 of the integrated circuit 100 while the storage capacitors 108 extend through the insulative layer 112 in the array portion 104 of the integrated circuit 100. One or more of the non-data storage capacitors 118 can be coupled to the underlying support circuitry wiring 116 via conductive contacts 120. This way, the non-data storage capacitors 118 can be used to filter noise from the underlying wiring 116 or for power stabilization, e.g. when one or more of the underlying wires 116 is a power supply line.

In more detail, the non-data storage capacitors 118 have a first electrode 122 in contact with a conductive layer 124 formed on an upper surface 125 of the insulative layer 112. In one embodiment, the conductive layer 124 forms a common connection node for at least some of the non-data storage capacitors 118 as shown in FIG. 1. The conductive layer 124 can be patterned so that different ones of the non-data storage capacitors 118 are connected in series and/or in parallel. Counter electrodes 126 of the non-data storage capacitors 118 can also be coupled together in different configurations by patterning a conductive material 128 formed on the counter electrodes 126, e.g., tungsten, aluminum, etc. The lower conductive layer 124 and the upper conductive material 128 can be patterned in any desirable way to form various series and/or parallel capacitor configurations. In one embodiment, different ones of the non-data storage capacitors 118 are coupled in series to stabilize high voltage peaks in the underlying support circuitry wiring 116. In another embodiment, different ones of the non-data storage capacitors 118 are coupled in parallel to stabilize high current peaks. In yet other embodiments, some of the non-data storage capacitors 118 are coupled in series while others are coupled in parallel so that both high voltage and current peaks can be stabilized.

Figure 2:
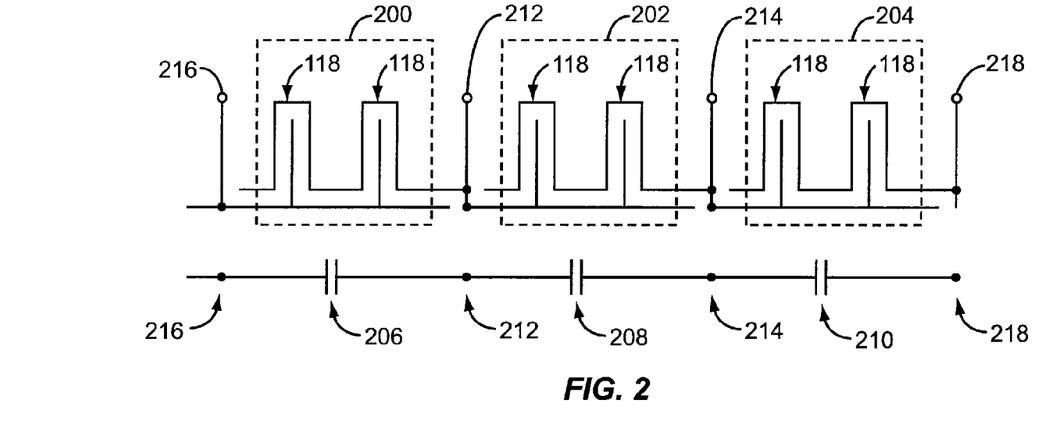
FIG. 2 is a schematic diagram of an embodiment of a series/parallel arrangement of the non-data storage capacitors illustrated in FIG. 1.
Figure 3:
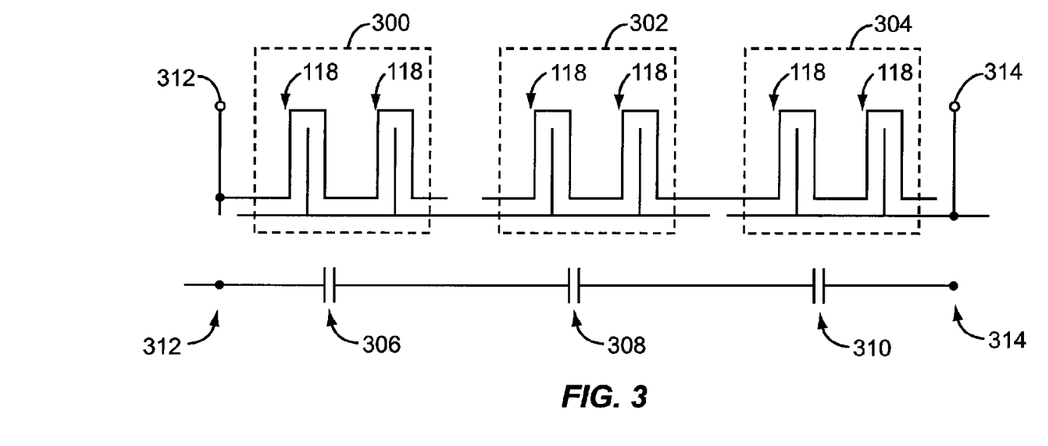
FIG. 3 is a schematic diagram of another embodiment of a series/parallel arrangement of the non-data storage capacitors illustrated in FIG. 1.

FIGS. 2 and 3 schematically illustrate two different embodiments of series/parallel non-data storage capacitor configurations. In FIGS. 2 and 3, three groups 200-204, 300-304 of the non-data storage capacitors 118 are shown. Each group 200-204, 300-304 includes two non-data storage capacitors 118 coupled in parallel. Particularly, the counter electrodes 126 of each group 200-204, 300-304 are coupled together, e.g., via the conductive material 128 shown in FIG. 1. The first electrodes 122 of each group 200-204, 300-304 are also coupled together, e.g., via the conductive layer 124 shown in FIG. 1. Connecting each group 200-204, 300-304 of the non-data storage capacitors 118 in this way yields three equivalent capacitors 206-210, 306-310 each having a parallel arrangement of two non-data storage capacitors 118. The three equivalent capacitors 206-210, 306-310 are coupled in series to form a series/parallel combination of non-data storage capacitors 118.

In FIG. 2, the counter electrode 126 of the first equivalent capacitor 206 is coupled to the first electrode 122 of the second equivalent capacitor 208 via a first conductive contact 212. The counter electrode 126 of the second equivalent capacitor 208 is similarly coupled to the first electrode 122 of the third equivalent capacitor 210 via a second conductive contact 214 to complete the series/parallel combination of non-data storage capacitors 118. Alternatively, the conductive layer 124 can be patterned to internally connect the first electrode 122 as shown in FIG. 3 without using the conductive contacts 212, 214. The conductive material 128 formed on the counter electrodes 126 can be similarly patterned to internally connect the counter electrodes 126 as shown in FIG. 3 also without using the conductive contacts 212, 214. In the embodiments illustrated in FIGS. 2 and 3, the main terminals of the series/parallel combination of non-data storage capacitors 118 are contacted by additional conductive contacts 216/218, 312/314. FIG. 1 shows an embodiment of a conductive contact 120 extending upward from the conductive layer 124 to a contact region (out of view) which can be used to connect the first electrodes 122 in any desired configuration. The non-data storage capacitors 118 can be coupled to other components as well.

Figure 4:
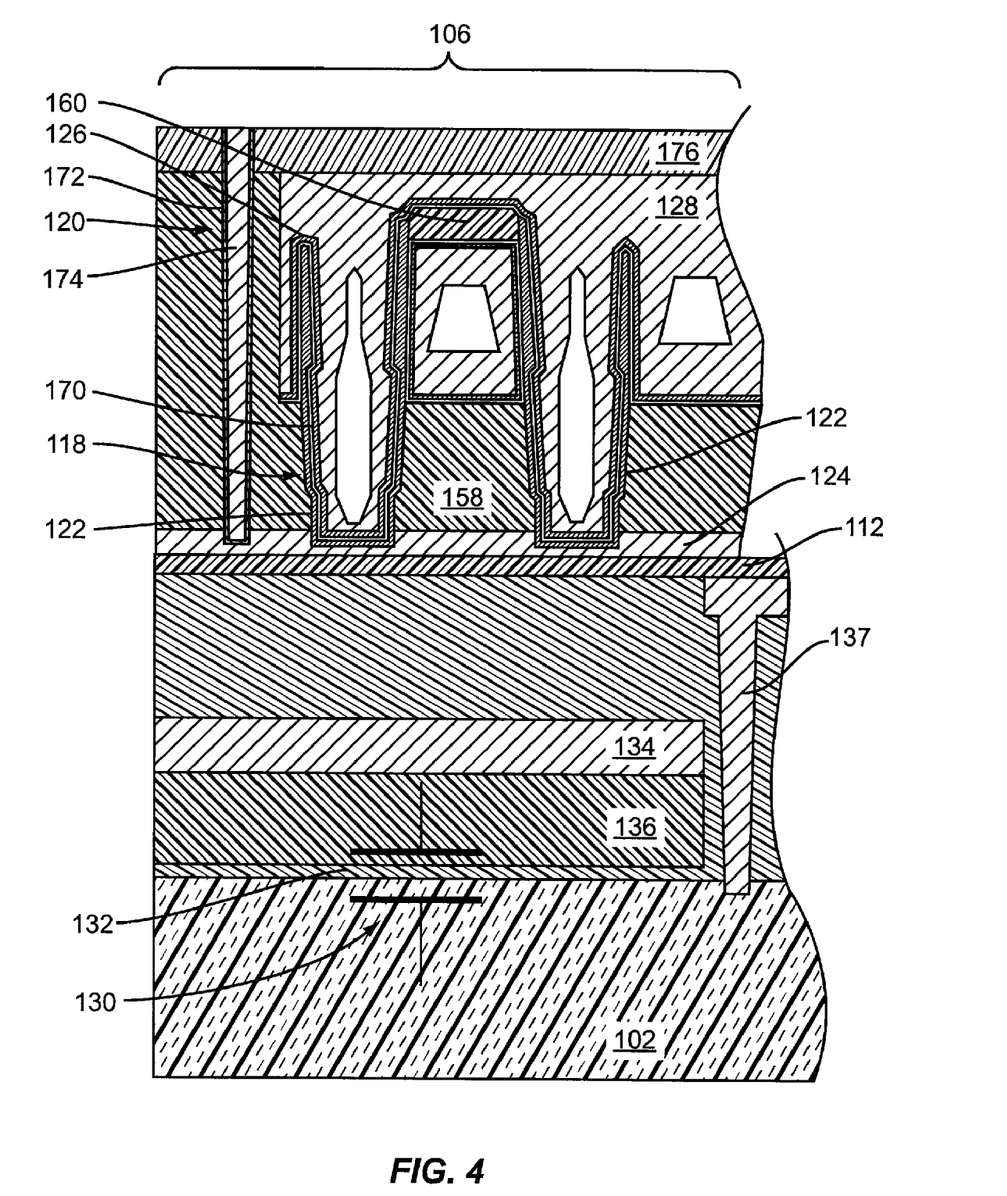
FIG. 4 is a cross-sectional view of an embodiment of an integrated circuit having non-data storage capacitors coupled to underlying substrate capacitors.

FIG. 4 illustrates a partial cross-sectional view of an embodiment of the support circuitry portion 106 of the integrated circuit 100 where the non-data storage capacitors 118 are connected to underlying substrate capacitors 130. The substrate capacitors 130 are formed below the insulative layer 112 in the semiconductor substrate 102. This way, different ones of the non-data storage capacitors 118 can be coupled in series and/or in parallel to different ones of the substrate capacitors 130. According to this embodiment, the substrate capacitors 130 comprise a dielectric material 132 interposed between the semiconductor substrate 102 and an electrode 134 arranged above the dielectric material 132. The electrode 134 contacts a polysilicon region 136 of the substrate 102. The electrode 134 can comprise any suitable conductive material such as W, Ti, TiN, or a noble metal like Ru, Pt or the like. The electrode 134 can be coupled to one of the overlying non-data storage capacitors 118 by a conductive contact (out of view). The dielectric material 132 can be a high-k material such as hafnium and zirconium silicates and oxides/oxynitrides (e.g., HfSiON, HfO$_2$, HfSiO, HfSiON, etc.) or a material such as silicon oxide, nitride or oxynitride or any other suitable dielectric material. The lower capacitor electrode formed by the semiconductor substrate 102 is also contacted by a conductive contact 137.

Figure 5:
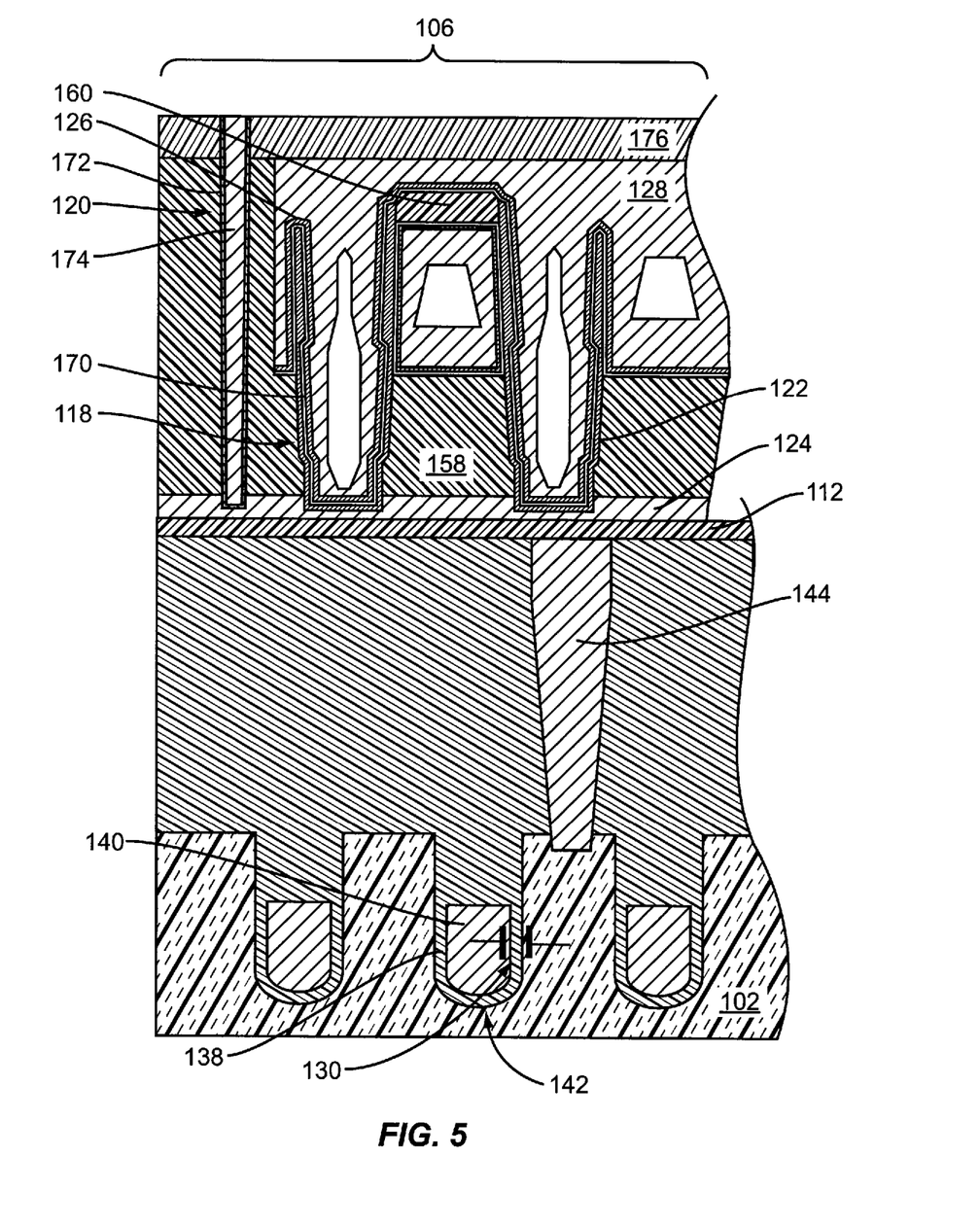
FIG. 5 is a cross-sectional view of another embodiment of an integrated circuit having non-data storage capacitors coupled to underlying substrate capacitors.

FIG. 5 illustrates a partial cross-sectional view of another embodiment of the support circuitry portion 106 of the integrated circuit 100 where the substrate capacitors 130 comprise a dielectric material 138 interposed between the semiconductor substrate 102 and a conductive material 140. The conductive material 140 is disposed in a trench 142 formed in the substrate 102. The dielectric material 138 can be a high-k material or a lower-k material. The outer capacitor electrode formed by the semiconductor substrate 102 is contacted by a conductive contact 144. The inner capacitor electrode formed by the conductive material 140 can be coupled to one of the overlying non-data storage capacitors 118 by a different conductive contact (out of view). The non-data storage and substrate capacitors 118, 130 can be coupled in any desired series/parallel combinations.

Figure 6:
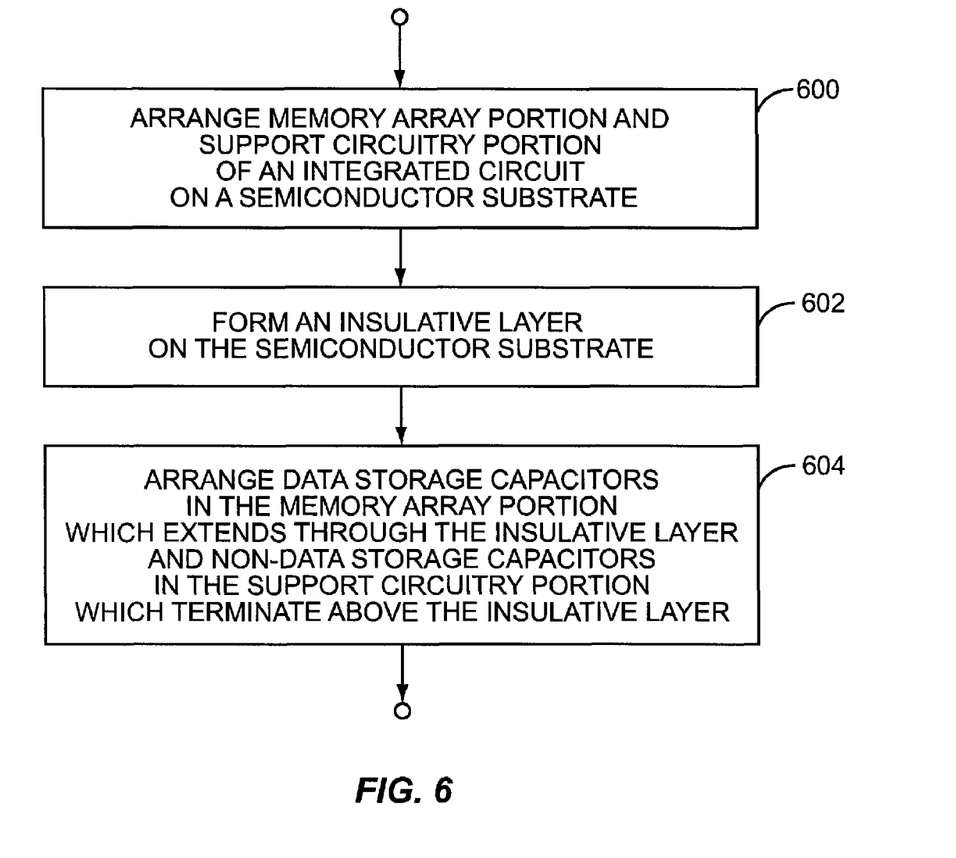
FIG. 6 is a flow diagram of an embodiment of a method for fabricating an integrated circuit having data storage and non-data storage capacitors.

FIG. 6 illustrates an embodiment of a method for fabricating the data storage and non-data storage capacitors 108, 118 of the integrated circuit 100. FIGS. 7A-7H illustrate the semiconductor substrate 102 during different stages of the fabrication process. The memory array portion 104 and support circuitry portion 106 are arranged on the semiconductor substrate 102 (Step 600). The wiring 110, 116 of the memory array and support circuitry sections 104, 106 may comprise tungsten or any other suitable conductive material. In one embodiment, the wiring 110, 116 is buried in the semiconductor substrate 102, e.g., in trenches formed in the substrate 102. In another embodiment, the memory array wiring 110 is buried in the semiconductor substrate 102 and the support circuitry wiring 116 is formed on the substrate surface 114. In other embodiments, the memory array wiring 110 and/or the support circuitry wiring 116 have multiple wiring levels at least some of which are buried in the semiconductor substrate 102 and others of which are formed on the substrate surface 114.

Figure 7A:
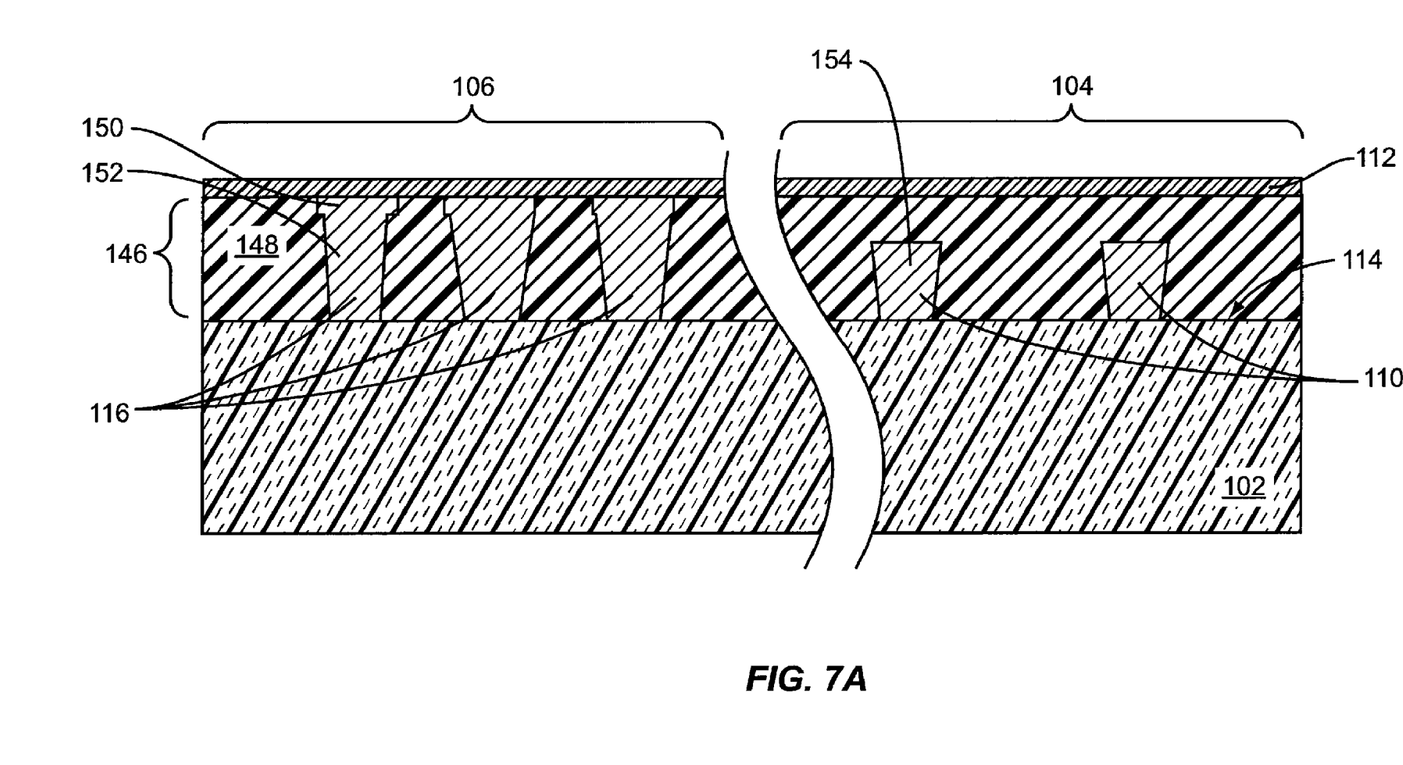
FIGS. 7A-7H are cross-sectional views of a semiconductor substrate during different stages of the method illustrated in FIG. 6.

The insulative layer 112 is formed on the semiconductor substrate 102 above the memory array wiring 110 and the support circuitry wiring 116 (Step 602). FIG. 7A illustrates an embodiment where an upper wiring level 146 is formed in an insulative material 148 disposed on the upper surface 114 of the semiconductor substrate 102. The upper wiring level 146 may include conductive lines 150 and contacts 152 as shown in the support circuitry portion 106 of the integrated circuit 100 or just conductive contacts 154 as shown in the array portion 104. The upper wiring level 146 may include other conductive line/contact configurations. The memory array wiring 110 and/or the support circuitry wiring 116 may include one or more additional wiring levels (out of view) arranged below the upper wiring level 146, e.g., buried in the semiconductor substrate 102. In one embodiment, the insulative layer 112 is formed by depositing $Si_3N_4$ on the upper wiring level 146 and the insulative material 148.

The data storage capacitors 108 are arranged in the memory array portion 104 and the non-data storage capacitors 118 are arranged in the support circuitry portion 106 (Step 604). The storage capacitors 108 extend through the insulative layer 112 to the memory array wiring 110. The non-data storage capacitors 118 pass through the same common plane 119 as the storage capacitors 108 above the insulative layer 112. However, the non-data storage capacitors 118 terminate above the insulative layer 112. The same processes can be used to form the storage and non-data storage capacitors 108, 118 when arranged in the common plane 119.

Figure 7B:
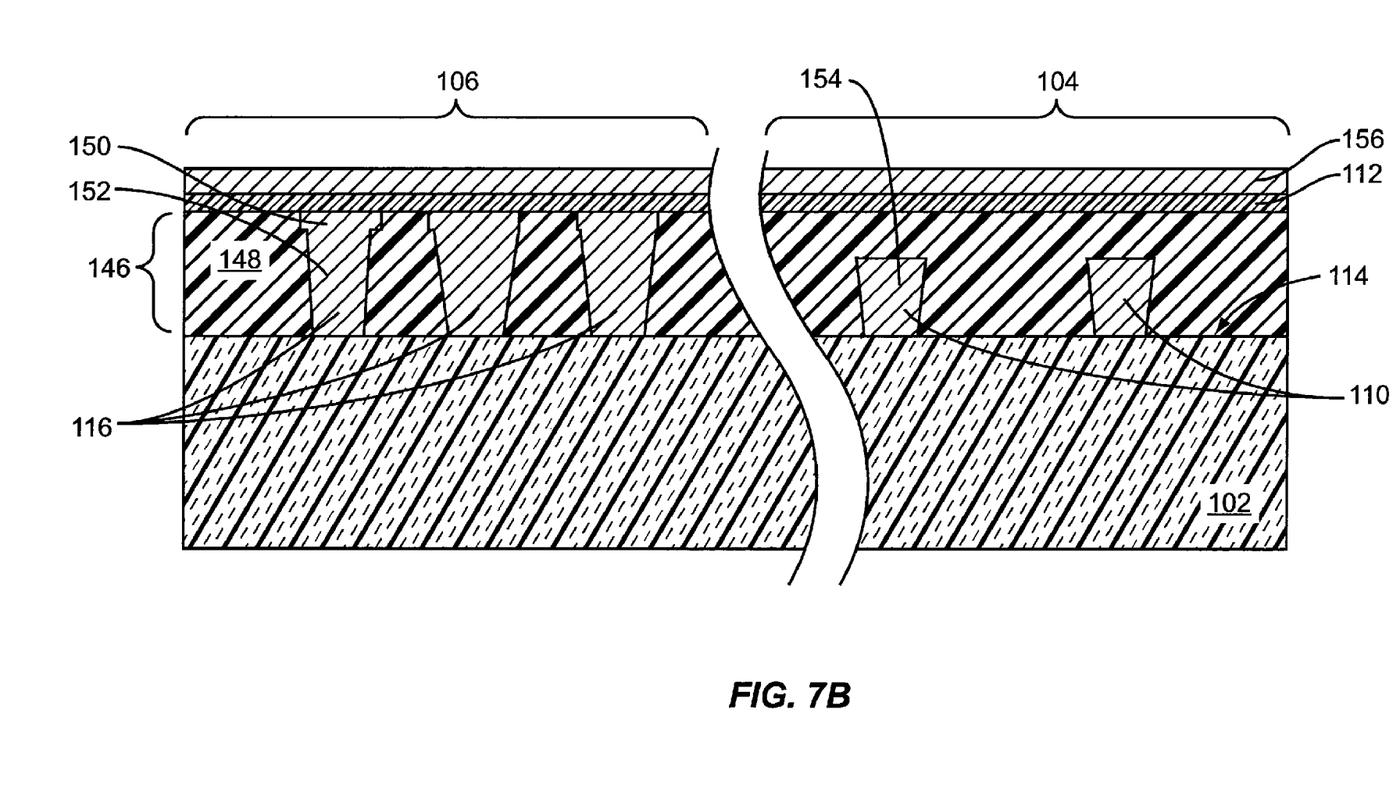
Figure 7C:
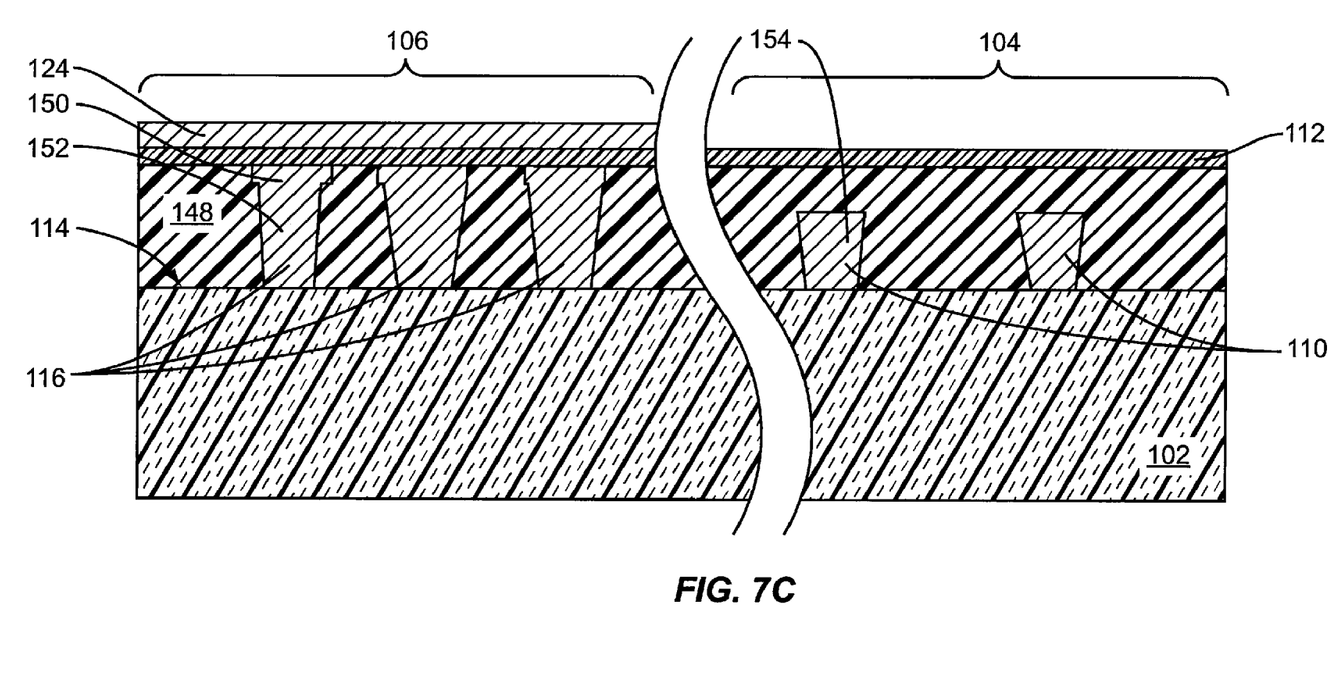

In more detail, a conductive material 156 is formed on the insulative layer 112 as shown in FIG. 7B. The conductive material 156 can be deposited on the insulative layer 112, e.g., by sputtering and may comprise any suitable conductive material such as tungsten, aluminum, titanium nitride, tantalum, tantalum nitride, copper, nickel, nickel alloys, cobalt, cobalt phosphate, etc. The conductive material 156 is then removed over the memory array wiring 110, forming the conductive layer 124 over the support circuitry wiring 116 as shown in FIG. 7C. The conductive material 156 can be removed over the memory array wiring 110 using a standard lithography block mask technique. This exposes the insulative layer 112 over the memory array wiring 110, but not over the support circuitry wiring 116. The conductive layer 124 can be patterned at this point if desired, e.g., by etching.

Figure 7D:
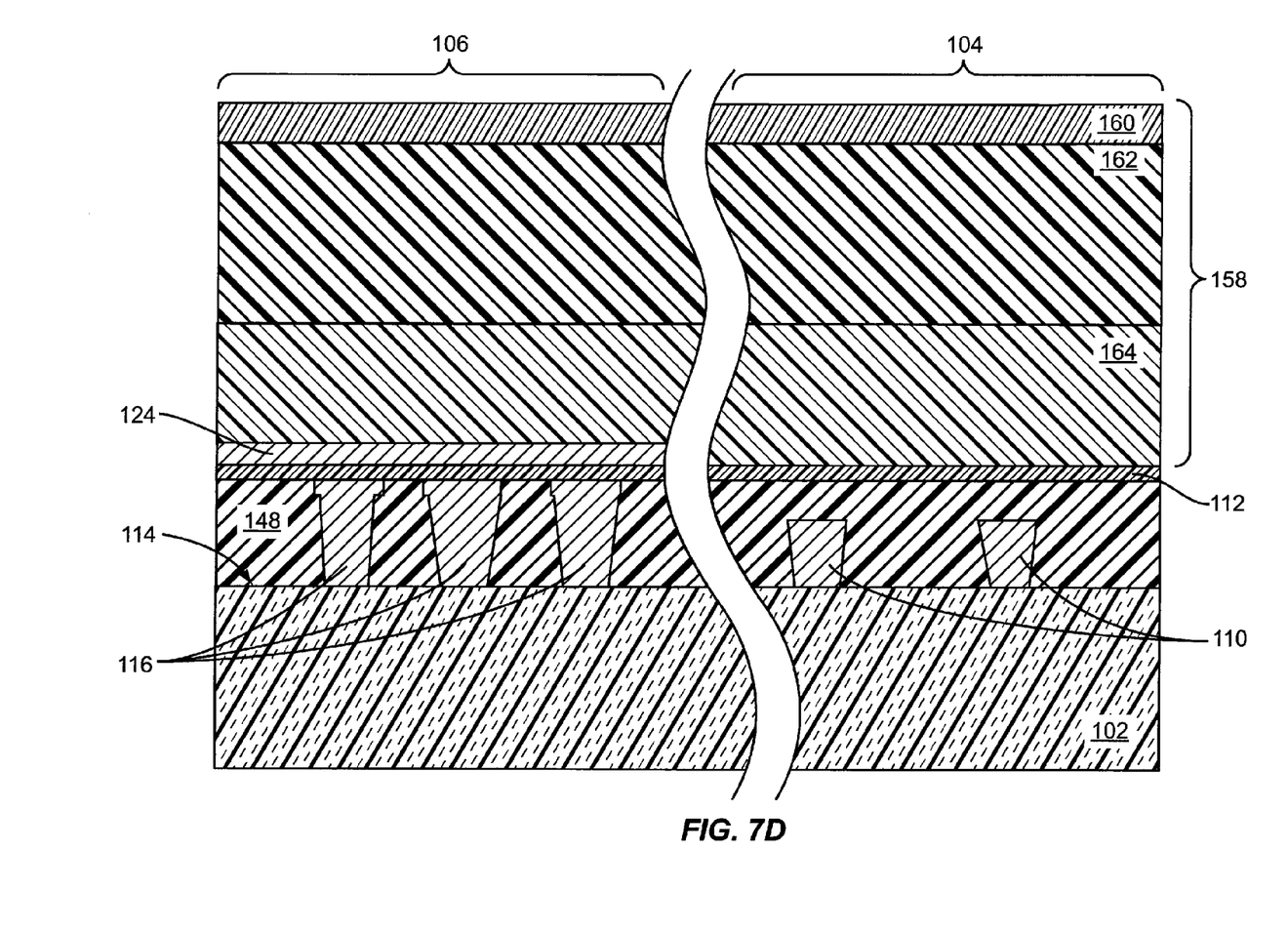
Figure 7E:
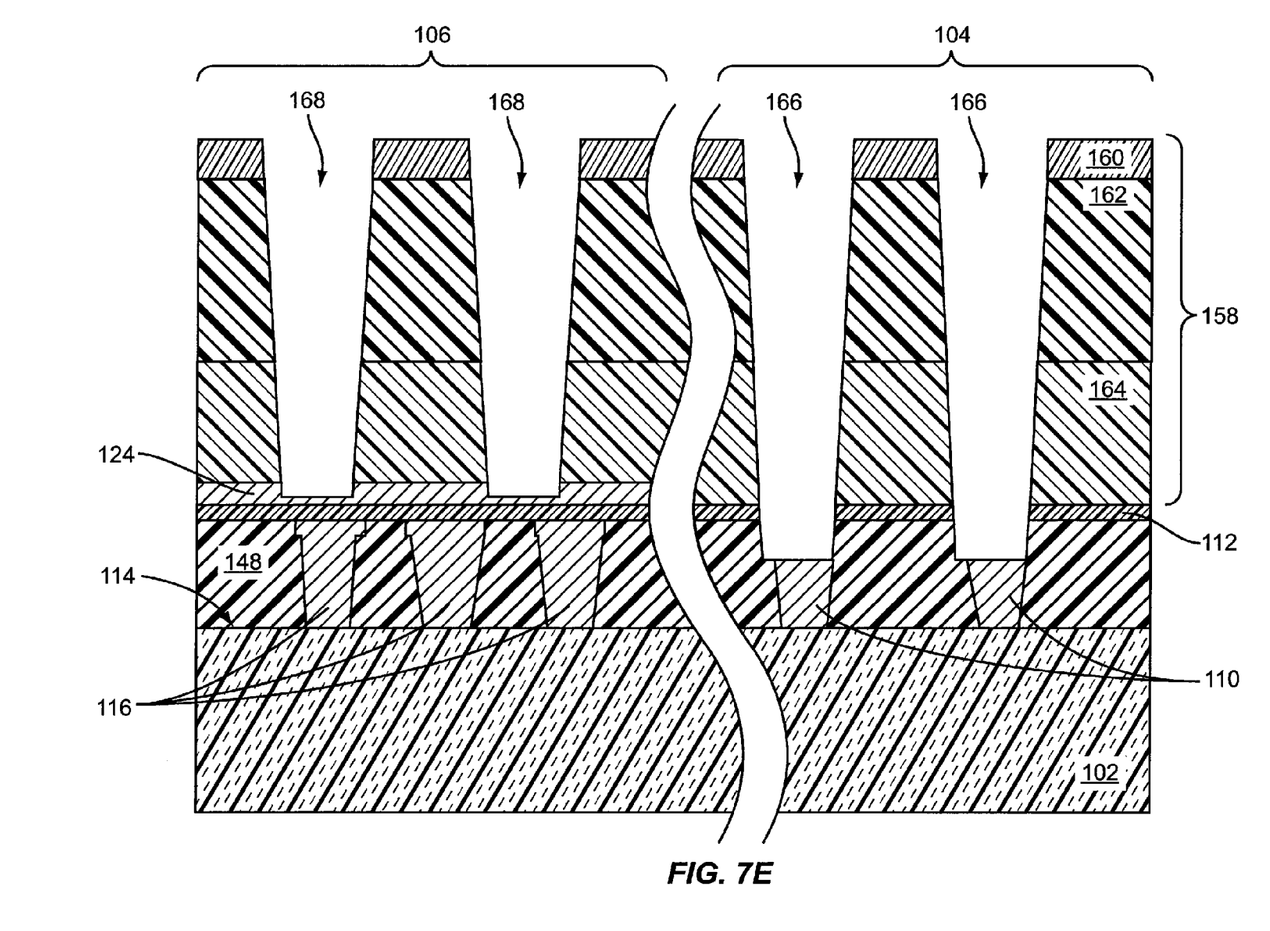

An insulative material 158 is then formed on the conductive layer 124 and the exposed portion of the insulative layer 112. The insulative material 158 can be a single layer of material, e.g., BPSG, $SiO_2$ or $Si_3N_4$. In another embodiment, the insulative material 158 can include multiple layers 160-164 as shown in FIG. 7D, e.g., $Si_3N_4$ stacked on $SiO_2$ stacked on BPSG. Openings 166 are formed in the insulative material 158 over the memory array wiring 110 which extend through the insulative material 158 and insulative layer 112 to the memory array wiring 110 as shown in FIG. 7E. Openings 168 are also formed in the insulative material 158 over the support circuitry wiring 116 which extend through the insulative material 158, but terminate at the conductive layer 124.

In an embodiment, the openings 166, 168 are formed by etching the insulative material 158 and the insulative layer 112 selectively to the conductive layer 124 until the memory array wiring 110 is exposed. That is, the conductive layer 124 functions as an etch stop in the support circuitry portion 106 of the integrated circuit 100 so that the openings 168 formed in this region do not extend through the conductive layer 124 to the underlying support circuitry wiring 116. On the other hand, the openings 166 formed in the array portion 104 of the integrated circuit 100 during the etch process extend through the insulative layer 112 to the underlying memory array wiring 110 because the conductive material 156 was previously removed in this region. This way, the same etch chemistry and resist mask can be used to form all openings 166, 168. In an embodiment, the etch process stops when the memory array wiring 110 is exposed, e.g., in accordance with a standard end-point detection technique.

Figure 7F:
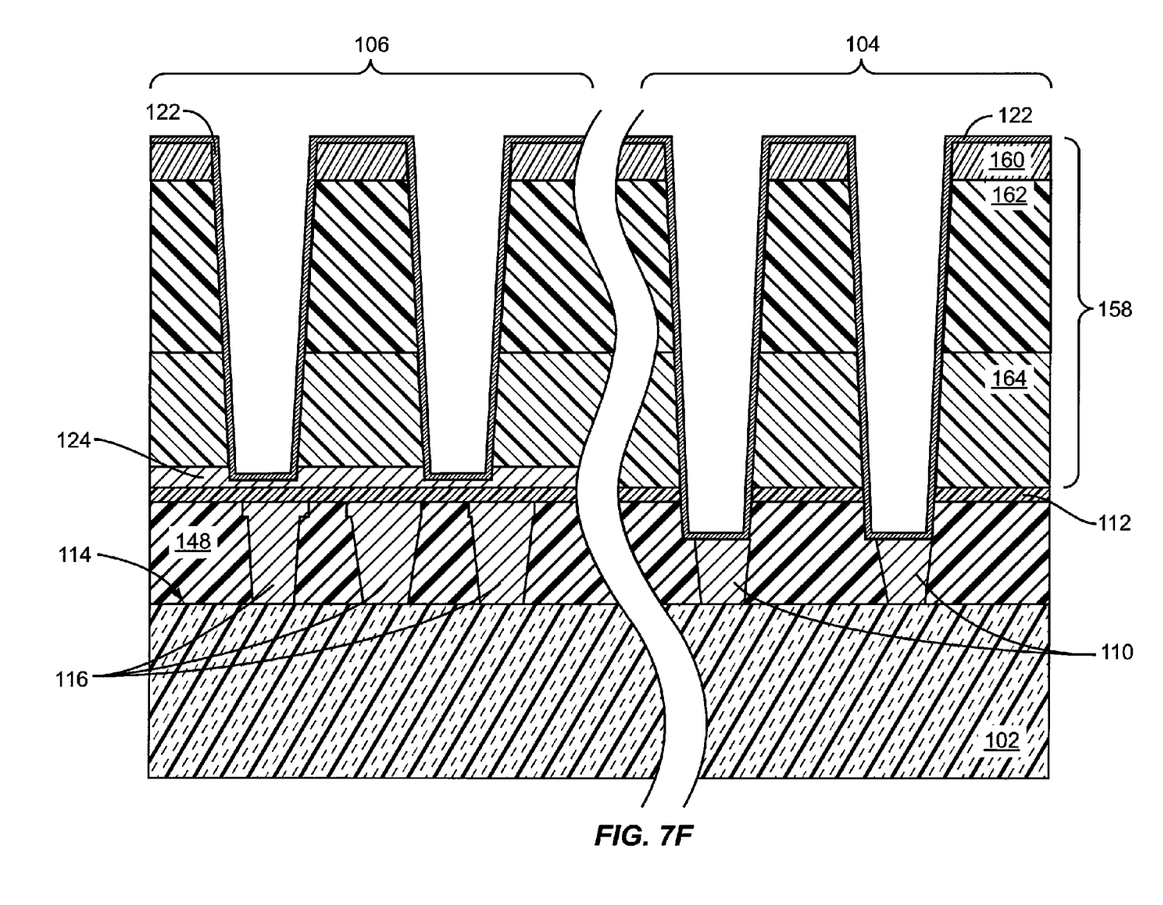
Figure 7G:
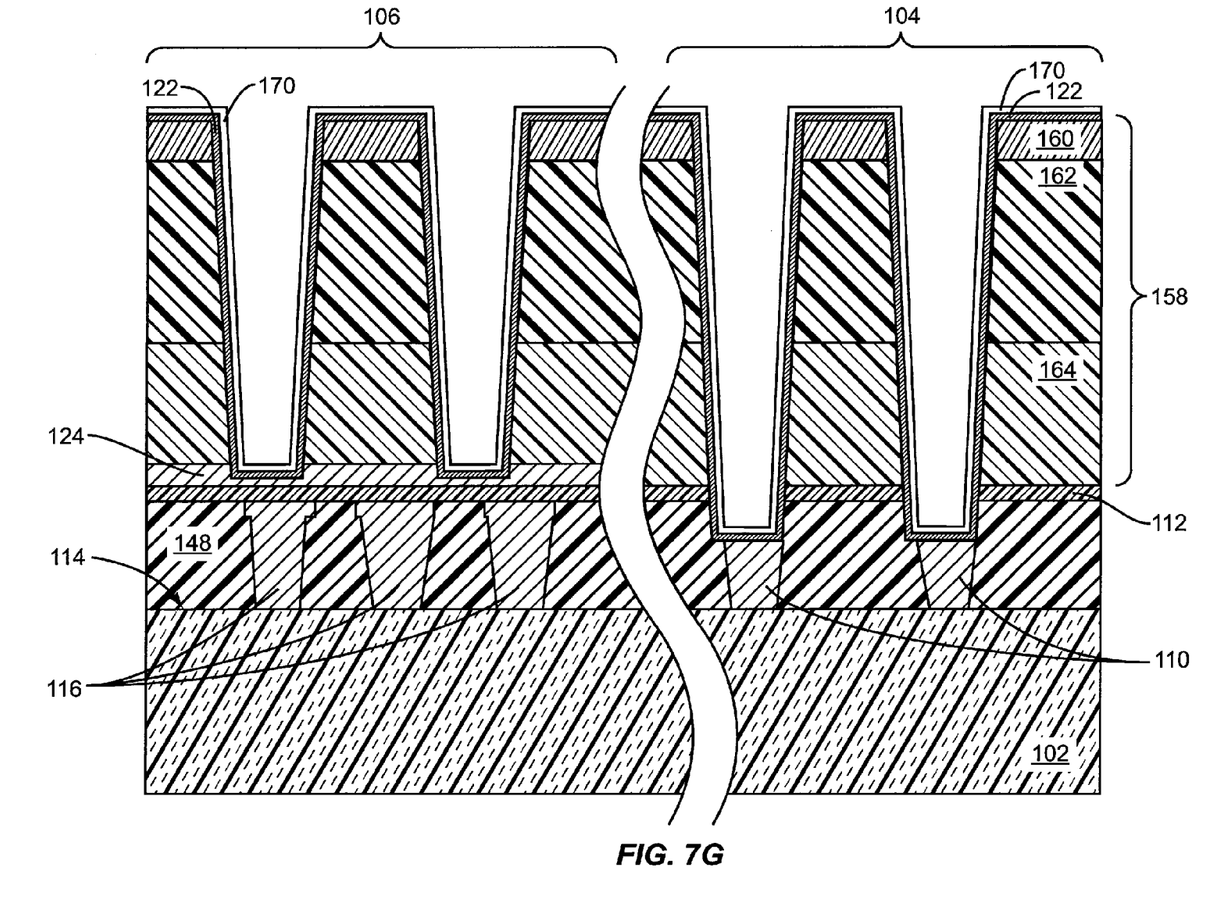
Figure 7H:
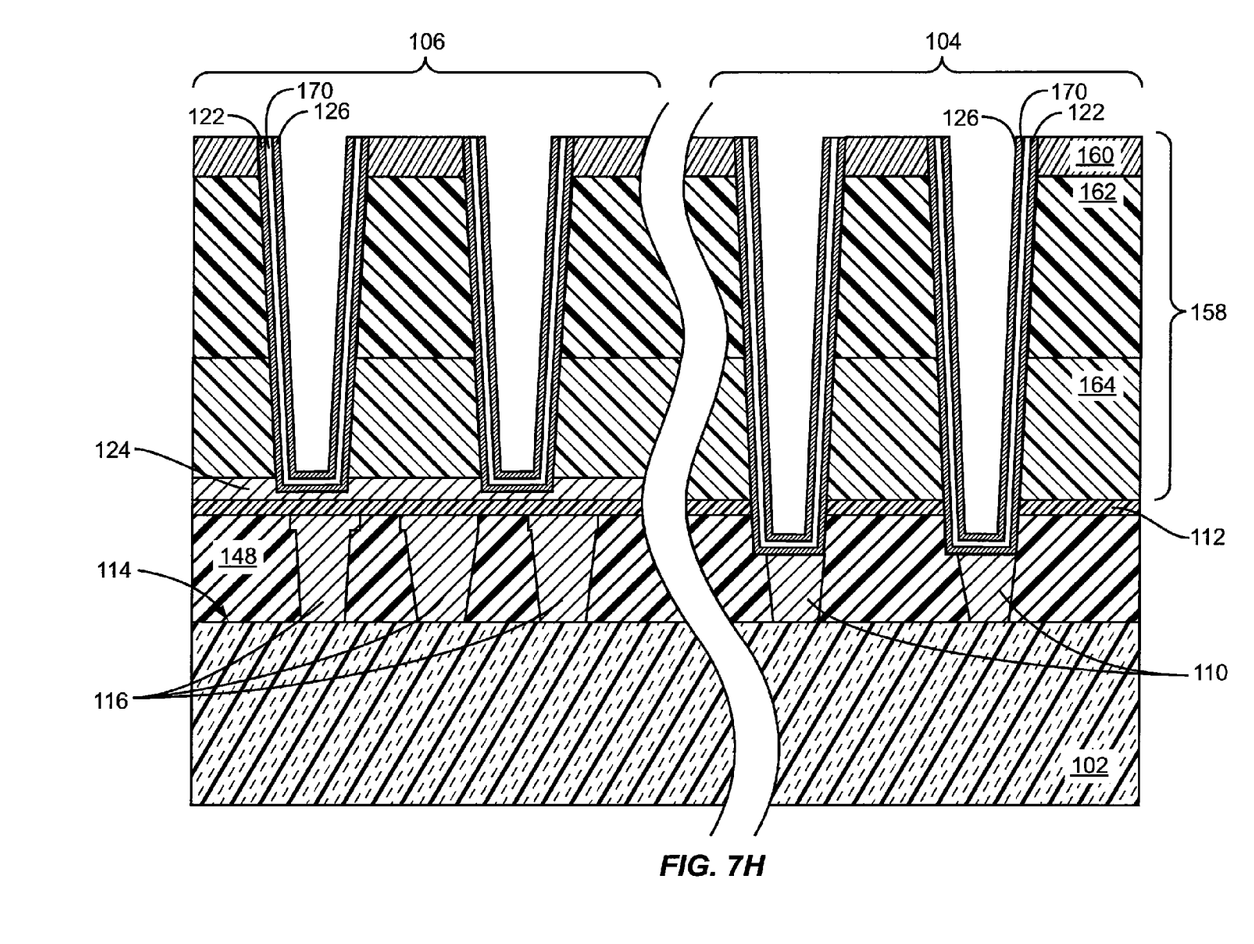

Next, the data storage and non-data storage capacitors 108, 118 are formed in the different openings 166, 168. The first electrodes 122 are formed by depositing a conductive material in the openings 166, 168 as shown in FIG. 7F. Any suitable conductive material can be used such as titanium, titanium nitride, etc. A dielectric material 170 is then deposited on the first electrodes 122 as shown in FIG. 7G. The dielectric material 170 can be a high-k material or a conventional dielectric material such as silicon oxide, nitride or oxynitride. The counter electrodes 126 are formed by depositing a conductive material on the dielectric material 170 as shown in FIG. 7H. Any suitable conductive material such as titanium, titanium nitride, etc. can be used to form the counter electrodes 126.

The conductive contacts 120 shown in FIG. 1 can also be formed during capacitor construction by creating an opening in the insulative material 158, lining the opening with a conductive material 172 such as titanium, titanium nitride, etc. and filling the remainder of the opening with another conductive material 174 such as tungsten, aluminum, etc. The conductive contact 120 extends upward from the conductive layer 124 to a contact region (out of view) such as a pad. An encapsulation layer 176 such as SiON or the like can be formed over the capacitors 108, 118 for protection during subsequent processing. Standard processing steps are performed to complete the memory device integrated circuit 100.

The data storage and non-data storage capacitors 108, 118 can have the same cross-sectional shape as shown in FIG. 1 and FIG. 7H or can have different cross-sectional shapes, e.g., elliptical and rectangular. In addition, the capacitors 108, 118 can be of any suitable structure. For example, FIG. 1 depicts the capacitors 108, 118 as crown-type capacitors where the counter capacitor electrode 126 is electrically contacted from both the inside and outside of the capacitors 108, 118 by conductive material 128. FIG. 7H illustrates another embodiment of the capacitors 108, 118 as cylindrical-type capacitors where the counter capacitor electrode 126 is electrically contacted from only the inside of the capacitors 108, 118. In yet another embodiment, the capacitors 108, 118 can be block-type capacitors where the counter capacitor electrode 126 is electrically contacted from only the outside of the capacitors 108, 118.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An integrated circuit, comprising:
   a memory array portion and a support circuitry portion arranged on a semiconductor substrate;
   an insulative layer formed on the semiconductor substrate;
   data storage capacitors located in the memory array portion and extending through the insulative layer; and
   non-data storage capacitors located in the support circuitry portion and terminating above the insulative layer.

2. The integrated circuit of claim 1, wherein the data storage and non-data storage capacitors pass through a common plane running generally parallel to and above the insulative layer.

3. The integrated circuit of claim 1, further comprising a conductive layer arranged above the insulative layer and in contact with an electrode of the non-data storage capacitors.

4. The integrated circuit of claim 3, wherein the conductive layer forms a common connection node for the non-data storage capacitors.

5. The integrated circuit of claim 3, wherein the conductive layer is patterned so that different ones of the non-data storage capacitors are connected in series and/or in parallel.

6. The integrated circuit of claim 1, wherein the data storage and non-data storage capacitors are disposed in openings formed in an insulative material arranged above the insulative layer.

7. The integrated circuit of claim 6, wherein each capacitor comprises first and second electrodes and a dielectric material disposed between the electrodes, wherein the electrodes and dielectric material of the data storage capacitors extend through the insulative material and insulative layer to an underlying wiring layer and wherein the electrodes and dielectric material of the non-data storage capacitors terminate above the insulative layer.

8. The integrated circuit of claim 1, wherein different ones of the non-data storage capacitors are coupled in series and/or in parallel.

9. The integrated circuit of claim 1, wherein at least some of the non-data storage capacitors are coupled to one or more power supply lines.

10. The integrated circuit of claim 1, wherein the data storage and non-data storage capacitors comprise a dielectric material of the same type.

11. The integrated circuit of claim 1, wherein the data storage and non-data storage capacitors have the same cross-sectional shape.

12. The integrated circuit of claim 1, wherein the non-data storage capacitors are arranged in at least two different groups, the non-data storage capacitors included in each group being coupled in parallel and the groups of capacitors being coupled in series.

13. The integrated circuit of claim 1, further comprising additional non-data storage capacitors formed below the insulative layer, wherein different ones of the non-data storage capacitors formed below the insulative layer are coupled in series and/or in parallel to different ones of the non-data storage capacitors that terminate above the insulative layer.

14. A method of fabricating an integrated circuit, comprising:

arranging a memory array portion and a support circuitry portion of the integrated circuit on a semiconductor substrate;

forming an insulative layer on the semiconductor substrate; and arranging data storage capacitors in the memory array portion which extend through the insulative layer and non-data storage capacitors in the support circuitry portion which terminate above the insulative layer.

15. The method of claim 14, comprising:

forming a conductive layer on the insulative layer in the support circuitry portion so that the insulative layer is exposed in the memory array portion;

forming an insulative material on the conductive layer and the exposed portion of the insulative layer;

forming openings in the insulative material in the memory array portion and the support circuitry portion, the openings in the memory array portion extending through the insulative material and insulative layer to an underlying wiring layer and the openings in the support circuitry portion extending through the insulative material and at least to the conductive layer; and forming capacitors in the different openings.

16. The method of claim 15, comprising patterning the conductive layer so that different ones of the non-data storage capacitors are connected in series and/or in parallel.

17. The method of claim 14, further comprising coupling at least some of the non-data storage capacitors to one or more power supply lines of the integrated circuit.

18. An integrated circuit, comprising:

a memory array portion and a support circuitry portion arranged on a semiconductor substrate;

an insulative layer formed on the semiconductor substrate;

data storage capacitors located in the memory array portion and extending through the insulative layer;

a first group of non-data storage capacitors located in the support circuitry portion and formed below the insulative layer;

a second group of non-data storage capacitors located in the support circuitry portion and terminating above the insulative layer; and wherein different ones of the capacitors in the first group of non-data storage capacitors are coupled in series and/or in parallel to different ones of the capacitors in the second group of non-data storage capacitors.

19. The integrated circuit of claim 18, wherein the data storage capacitors and the second group of non-data storage capacitors pass through a common plane which runs generally parallel to and above the insulative layer.

20. The integrated circuit of claim 18, wherein the capacitors in the first group of non-data storage capacitors comprise a dielectric material interposed between the semiconductor substrate and an electrode arranged on the semiconductor substrate.

21. The integrated circuit of claim 18, wherein the capacitors in the first group of non-data storage capacitors comprise a dielectric material interposed between the semiconductor substrate and a conductive material disposed in a trench formed in the semiconductor substrate.

* * * * *